April 2, 1963 G. ROSIER ET AL 3,084,290
DETECTOR CIRCUIT ARRANGEMENT
Filed Sept. 8, 1959
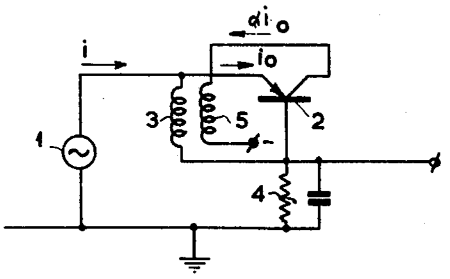
INVENTORS
GERARDUS ROSIER
JOHANNES VAN DER POEL
BY
Frank R Jufari
AGENT

United States Patent Office 3,084,290

Patented Apr. 2, 1963

3,084,290
DETECTOR CIRCUIT ARRANGEMENT

Gerardus Rosier and Johannes van der Poel, Hilversum, Netherlands, assignors to North American Philips Company, Inc., New York, N.Y., a corporation of Delaware Filed Sept. 8, 1959, Ser. No. 838,740
Claims priority, application Netherlands Sept. 30, 1958
2 Claims. (Cl. 329—101)

This invention relates to circuit arrangements for detecting electric signals and, more specifically, to such circuits including a transistor in which the emitter-base path of the transistor is utilized.

In a known circuit of this kind, the source of the modulated carrier signal is included, in series with a detector output filter, in the base circuit of the transistor. Between the collector and the emitter of the transistor there is provided a feed-back network for the carrier, while furthermore an output filter for the carrier is connected in the collector circuit. The carrier signal which is set up between the emitter and the base is amplified by the feedback and hence produces an amplified detected signal across the detector filter by emitter-base rectification. This signal is applied to the base of the transistor and consequently appears again in amplified form across the output filter.

This known circuit arrangement has a limitation in that it tends to oscillate with small variations of the transistor parameters and hence is not very stable. In addition, the transistor is adjusted to an operating point which is unfavorable for application due to the base detector filter. The present invention is directed to an improved detector circuit arrangement which provides highly stable operation in a manner which is less complex and more economical. According to the invention, the transistor is connected as a peak current detector by means of an inductance directly connected between its emitter and its base, the value of the inductive reactance being high at the frequency of the carrier signal but low at the frequency of the detected signal; the inductance forms a winding of a feedback transformer, the other winding of which is connected in the collector circuit of the transistor.

In order that the invention may readily be carried out, an embodiment thereof will now be described with reference to the accompanying diagrammatic drawing, the single FIGURE of which is an embodiment of a detector circuit according to the invention.

In the figure, reference numeral 1 denotes a current source of a modulated carrier signal. It may comprise the output circuit of a preceding intermediate-frequency transistor amplifier. The oscillations of the source 1 are applied to the emitter-base circuit of a transistor 2 which is connected as a peak current detector: an inductance 3 is connected between its emitter and its base, the value of the inductive reactance at the carrier frequency being high as compared with the emitter-base input resistance of the transistor 2; at the frequency of the detected signal, however, the inductive reactance has so small a value that this detected signal substantially appears across a detector output filter 4. This filter 4 is connected in the base circuit of the transistor 2 but may, if required, as well be connected in the collector circuit. Due to its slight impedance at the carrier signal frequencies, the transistor 2 is operated for these frequencies in common base arrangement, while owing to the slight impedance of the inductance 3 at the detected signal frequencies, the filter 4 passes not only the detected current produced in the emitter circuit, but also that produced in the base circuit.

In order to increase the detector efficiency, the inductance 3 is coupled with a winding 5 connected in the collector circuit of the transistor 2 to form a feedback transformer through which the carrier signal produced in the collector circuit is fed back in the positive sense to the emitter-base path of the transistor 2.

The circuit arrangement operates as follows:

Assuming the amplitude of the carrier alternating current supplied by the source 1 to be $i$ and the detected current flowing through the emitter-base path of the transistor 2 to be $i_0$, the latter has a value substantially equal to $i$ when the feedback winding 5 is absent; this is due to the action of the inductance 3 (peak current detection). This current $i_0$ produces an alternating current of amplitude $\alpha i_0$ in the collector circuit, where $\alpha$ is the emitter-collector current amplification factor of the transistor 2. If the ratio of the turns number of the inductance 3 to that of the winding 5 (transformation ratio) is $n$, this current $\alpha i_0$ produces, upon transformation, a current $$\frac{\alpha}{n}i_0$$

in the winding 3, which current can be considered as an additional current source connected in parallel with the source 1. From this it follows that $$i_0=i+\frac{\alpha}{n}i_0=\frac{i}{1-\frac{\alpha}{n}}$$

For a value $n=1$ we find:

$$i_0=\frac{i}{1-\alpha}=\alpha' i$$

where $\alpha'$ is the collector-base current amplification factor of the transistor. Hence, the detector efficiency can in this manner be appreciably increased without risk of instability of the circuit arrangement. If the transformation ratio is made slightly greater than 1 and at most equal to 2, the detection efficiency is reduced; however, the detection sensitivity then is less dependent upon the transistor used. If, however, $n$ is made less than 1 or if the transistor is connected in common emitter arrangement for the carrier signals the risk of instability of the circuit arrangement is materially increased.

In a practical embodiment for the detection of intermediate-frequency oscillations having a carrier frequency of 0.5 mc./s. and a modulation frequency of 3 kc./s., use was made of a transistor of the type OC 44. The inductance 3 had a value of 0.5 mh., the transformation ratio $n$ was 3/2; the filter 4 comprised a resistor of 470 ohms and a capacitor of 38,000 mmf. The detection efficiency was increased by a factor of 3 in this manner.

Obviously, the invention can be applied not only to amplitude detectors, but also to frequency detectors, if current-detecting transistors are used therein.

While we have described our invention in connection with specific embodiments and applications, other modifications thereof will be readily apparent to those skilled in this art without departing from the spirit and scope of the invention as defined in the appended claims.

What is claimed is:

1. A circuit arrangement for signal detection comprising a transistor having, base, emitter and collector electrodes, means for supplying a modulated carrier signal to the emitter of the transistor, the base electrode of said transistor being connected, for the frequencies of said modulated carrier signal, to a point of reference potential, a first inductance directly connected between the base and emitter electrodes, said inductance having an impedance value which is high at the carrier frequency and low at the detected signal frequency and a second inductance inductively coupled to said first inductance in positive feed back arrangement for said modulated carrier signal and connected in the collector circuit of the transistor, the ratio of turns of said first and second inductances lying between 1 and 2.

2. A circuit arrangement for demodulating electrical signals within a first frequency band which are modulated by modulating signals within a second frequency band comprising: a transistor having base, emitter and collector electrodes, two parallel branches connected between the emitter and base electrodes of said transistor, the first of said branches comprising means for applying said modulated electrical signals to the emitter-base circuit of the transistor, the second of said branches comprising a first inductance having an impedance value which is high at frequencies within said first frequency band and low at frequencies within said second frequency band to provide peak current rectification by said transistor, a second inductance inductively coupled to said first inductance, said second inductance being connected in the collector circuit of the transistor, and filter means coupled to said transistor, said filter means producing demodulated signals within said second frequency band.

References Cited in the file of this patent

UNITED STATES PATENTS

| | | |
|---|---|---|
| 2,873,359 | Cooper et al. | Feb. 10, 1959 |
| 2,897,378 | Jones | July 28, 1959 |
| 2,921,196 | Chow | Jan. 12, 1960 |